United States Patent [19]

Thome

[11] 4,034,466
[45] July 12, 1977

[54] PACKAGE AND METHOD FOR A SEMICONDUCTOR RADIANT ENERGY EMITTING DEVICE

[75] Inventor: Gene P. Thome, Scottsdale, Ariz.
[73] Assignee: Motorola, Inc., Schaumburg, Ill.
[21] Appl. No.: 623,683
[22] Filed: Oct. 20, 1975

Related U.S. Application Data

[62] Division of Ser. No. 502,582, Sept. 3, 1974.
[51] Int. Cl.² .......................................... B01J 17/00
[52] U.S. Cl. ............................... 29/588; 29/576 S; 357/30
[58] Field of Search ............ 29/588, 576 S; 357/30

[56] References Cited

U.S. PATENT DOCUMENTS 3,735,483  5/1973  Sheldon .............................. 29/588
3,742,599  7/1973  Desmond ............................ 29/588
3,820,237  6/1974  Effer .................................... 29/588

Primary Examiner—W. Tupman
Attorney, Agent, or Firm—Kenneth R. Stevens

[57] ABSTRACT

Method and structure for encapsulating or providing a package for a light emitting semiconductor device in order to prevent package failure due to chemical contaminants. A light emitting semiconductor chip is connected to terminal leads having sharp angular portions. The device and the sharp angular portions are coated with a resilient elastomeric resin material inner core. An outer core comprising an acrylic or polycarbonate plastic material is injection molded over the inner core so as to leave exposed terminal leads for interconnection to electrical substrates such as cards or printed circuit boards.

2 Claims, 4 Drawing Figures

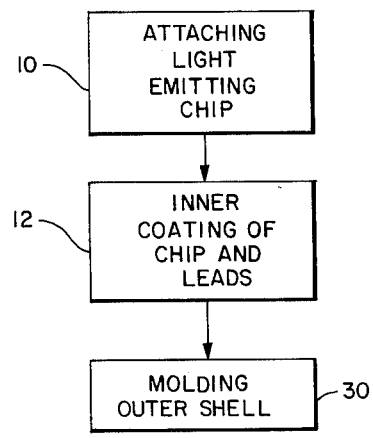
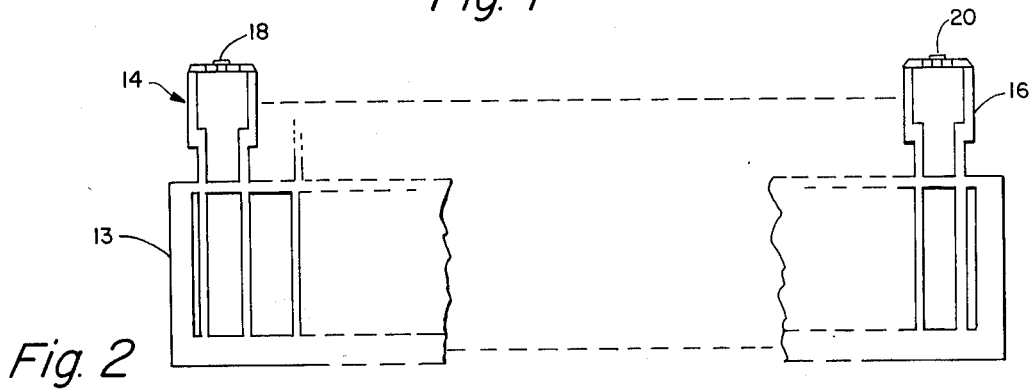
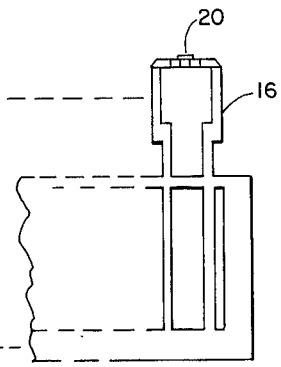
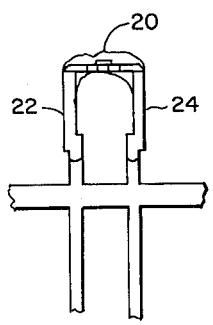
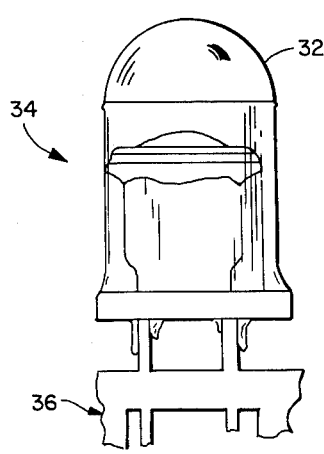

PACKAGE AND METHOD FOR A SEMICONDUCTOR RADIANT ENERGY EMITTING DEVICE

This is a division, of application Ser. No. 502,582, filed Sept. 3, 1974.

BACKGROUND OF THE INVENTION

1. Field of the Invention

This invention relates to method and structure for packaging a semiconductor device, and more particularly a semiconductor device for emitting radiant energy.

2. Description of the Prior Art

In the past, thermosetting and thermoplastic materials, such as acrylics or polycarbonates, have been employed to encapsulate light emitting diode semiconductor devices. Normally, a plurality of light emitting diodes are electrically bonded to respective lead pairs on a lead frame structure. After the device bonding operation the entire lead frame structure is inserted in an injection molding apparatus and all of the devices are encapsulated by employing injection molding techniques. Thereafter, each of the lead pairs are then separated from the overall lead frame structure for use in interconnection substrates, such as, cards or boards. This batch processing reduces cost and simplifies handling during the overall encapsulating or packaging process.

Normally, when the separate devices are used on cards or boards it is necessary to connect the exposed terminal leads to other circuitry and soldering is often the preferred technique. However, the overall soldering technique requires that the in situ soldered light emitting semiconductor device be rinsed and cleaned by using a suitable solvent in order to remove the solder flux.

This procedure causes a totally unexpected problem in that while the overall packaged light emitting device was virtually indestructible during normal lifetime usage, the exposure of the package device to solvents in many instances completely destroyed the integrity of the injected molded outer package producing internal cracks or a "fried marble" appearance. Naturally, these defects completely destroyed the requisite light transmitting qualities of the package.

Although the phenomena is not completely understood, the injection molding of an acrylic or polycarbonate plastic material over the light emitting device apparently creates latent stresses in the device package. These latent streeses are released when exposed to certain solvents causing package damage.

One obvious suggested solution is to increase the strength of the acrylic or polycarbonate material in order to allow it to withstand the exposure to certain chemical solvents. However, this solution has its drawbacks when applied to light emitting diode devices. The addition of strengthening material to the acrylic or polycarbonate material detracts from the light or radiant energy transmitting qualities of the cured material.

In looking at the prior art, it is found that elastomeric resilient silicone resins have been employed to protect semiconductor devices per se. That is, the silicone resins provide both mechanical and device protection to the semiconductor device. However, with respect to the problem leading to the present invention, the semiconductor device was in itself undamaged by the release of these package stresses upon contact with the solvent cleaner, but the package was damaged. Moreover, it was found that if noninjection molding techniques were employed to form the polycarbonate or acrylic package, then these latent package stresses were often avoided. This latter solution of course suffers in that it loses all of the batch processing, time, and cost advantages associated with injection molding.

Further, during the analysis of the apparent mechanisms leading to package failures resulting from the release of latent internal stresses, it was found that minimal package damage was experienced even using injection molding techniques when the lead structure was constituted by non-angular straight portions. Thus, it has been theorized that the creation of these latent stresses are further aggravated by the existence of sharp structural angular lead edges.

SUMMARY OF THE INVENTION

It is therefore an object of the present invention to provide a package or encapsulating technique for radiant emitting or light emitting semiconductor devices which maintains the light transmitting qualities and package structural integrity when subjected to potential chemical contaminants, such as, a solvent cleaner.

Another object of the present invention is to provide a reliable package for a light emitting semiconductor device which can be formed by batch processing and injection molding techniques.

A further object of the present invention is to provide a high intergrity encapsulating package for radiant or light emitting semiconductor devices which require electrically conductive angular terminal leads.

In accordance with the aforementioned objects, the present invention provides method and structure for encapsulating a radiant energy emitting semiconductor chip by completely coating the chip and all angular edge portions of the terminal leads with a resilient, rubber-like silicone resin inner encapsulating core and then completely covering the inner core with an outer encapsulating radiant energy transmitting core by injection molding of a plastic material.

DESCRIPTION OF THE DRAWINGS

FIG. 1 illustrates the basic process steps required for forming the light emitting diode encapsulated package.

FIG. 2 illustrates a lead frame structure, partially broken away, showing the beginning and ending terminal pairs and having light emitting semiconductor chips attached thereto.

FIG. 3 illustrates a specific lead pair location broken away from the structure of FIG. 2 with the light emitting diode chip and all the sharp angular edge portions of the terminal leads covered with a resilient rubber-like silicone resin material for forming an inner encapsulating core.

FIG. 4 illustrates the structure of FIG. 3 after being completely covered with an outer encapsulating radiant energy transmitting core by injection molding of a plastic material, but prior to its separation from the lead frame structure illustrated in FIG. 2.

DESCRIPTION OF THE PREFERRED EMBODIMENTS

Now referring to the FIGURES, FIG. 1 illustrates the basic process steps required for protecting the light emitting semiconductor chip package. At 10, a plurality of chips are bonded or attached to lead frame terminal locations by suitable means such as wire bonding, soldering, etc. A lead frame structure 12 is illustrated in FIG. 2 and shows the first and last terminal pair sites 14 and 16. Light emitting semiconductor chips 18 and 20 are attached to the planar terminal locations associated with terminal pairs 14 and 16, respectively.

At 12, each of the terminal pair locations are coated with a resilient, rubber-like silicone resin for forming an inner core 20 as illustrated in FIG. 3. The inner core 20 completely covers the light emitting semiconductor chip and all the sharp angular edge portions of the terminal leads 22 and 24. One suitable silicone resin material is known as DC-R6103 supplied by the At 30, the structure illustrated in FIG. 3 is then subjected to an injection molding operation in order to form an outer cured plastic core 32 which completely surrounds the inner core 20. In the preferred embodiments, the material used to form the outer core 32 comprises thermosetting or thermoplastic acrylic or polycarbonates having the desired radiation transmitting qualities and characteristics compatible with the particular radiant energy being emitted by the semiconductor light emitting device. One suitable material for forming the outer core 32 is an acrylic thermoplastic material known as V8-11 supplied by the Roman Haas Company.

Once the encapsulated device 34 is separated from the lead frame structure 36 it is then connected to interconnection substrates, such as, printed circuit boards, card, etc. by soldering. The use of chemicals such as perchlorothylene to dissolve solder fluxes after soldering the device 34 in situ does not damage the structural and light transmitting integrity of the outer core 32. Thus, the inner core 20 protects the outer core 32 from the release of latent stresses due to contact with chemical contaminants.

Although specific materials have been designated for the inner core material, outer core material, and the chemical solvent contaminant it is to be realized that numerous other compounds and chemical materials may be readily substituted or provide the same effect and result as those examples specifically taught herein.

What is claimed is:

1. A method of protecting a radiant energy emitting semiconductor chip package comprising the steps of:
 a. providing a pair of continuous, separated electrically conducting leads, each having elongated portions, and each elongated portion terminating at a respective same one end in a pair of chip terminal locations angularly disposed with respect to its elongated portion, each of said elongated portions further including angular portions;
 b. joining a semiconductor chip to said pair of chip terminal locations;
 c. forming and disposing a continuous elastomeric resin encapsulating layer around said semiconductor chip and said angular portions and extending downwardly along said elongated portions so as to leave exposed the other same ends of said conducting leads;
 d. forming and disposing a solid injection molded outer plastic acrylic or polycarbonate housing around and completely covering said encapsulating layer, said outer plastic housing and said encapsulating layer comprising material capable of transmitting radiant energy emitted by said semiconductor chip.

2. A method of protecting a radiant energy emitting semiconductor chip package as in claim 1 further including the step of:
 a. subjecting said other same ends to a solvent whereby said encapsulating layer protects said outer plastic housing from cracking due to stresses induced by said solvent.

* * * * *